(12) United States Patent
Chen et al.

(10) Patent No.: US 12,140,159 B2
(45) Date of Patent: Nov. 12, 2024

(54) HEAT DISSIPATION SYSTEM OF ELECTRONIC DEVICE

(71) Applicant: Acer Incorporated, New Taipei (TW)

(72) Inventors: Tsung-Ting Chen, New Taipei (TW); Wen-Neng Liao, New Taipei (TW); Cheng-Wen Hsieh, New Taipei (TW); Yu-Ming Lin, New Taipei (TW); Wei-Chin Chen, New Taipei (TW); Chun-Chieh Wang, New Taipei (TW); Shu-Hao Kuo, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 18/407,486

(22) Filed: Jan. 9, 2024

(65) Prior Publication Data

US 2024/0141922 A1    May 2, 2024

Related U.S. Application Data

(62) Division of application No. 17/223,018, filed on Apr. 6, 2021, now Pat. No. 11,913,472.

(30) Foreign Application Priority Data

Apr. 13, 2020 (TW) ................. 109112344

(51) Int. Cl.
  *F04D 29/58* (2006.01)
  *F04D 29/28* (2006.01)
  *F04D 29/42* (2006.01)

(52) U.S. Cl.
  CPC ......... *F04D 29/582* (2013.01); *F04D 29/281* (2013.01); *F04D 29/4226* (2013.01)

(58) Field of Classification Search
  CPC ........ F04D 17/16; F04D 29/403; F04D 29/42; F04D 29/4206; F04D 29/4222; F04D 29/4226; F04D 29/4246
  See application file for complete search history.

(56) References Cited

U.S. PATENT DOCUMENTS

| | | | |
|---|---|---|---|
| 6,778,390 B2 * | 8/2004 | Michael | H01L 23/467 361/679.48 |
| 2008/0019827 A1 * | 1/2008 | Hirata | F04D 29/582 415/206 |

* cited by examiner

*Primary Examiner* — Brian O Peters
(74) *Attorney, Agent, or Firm* — JCIPRNET

(57) ABSTRACT

A heat dissipation system of an electronic device including a body, a plurality of heat sources disposed in the body, and at least one centrifugal heat dissipation fan disposed in the body is provided. The centrifugal heat dissipation fan includes a housing and an impeller disposed in the housing on an axis. The housing has at least one inlet on the axis and has a plurality of outlets in different radial directions, and the plurality of outlets respectively correspond to the plurality of heat sources.

8 Claims, 6 Drawing Sheets

US 12,140,159 B2

HEAT DISSIPATION SYSTEM OF ELECTRONIC DEVICE

CROSS-REFERENCE TO RELATED APPLICATION

This is a divisional application of patent application Ser. No. 17/223,018, filed on Apr. 6, 2021, which claims the priority benefit of Taiwan application serial no. 109112344, filed on Apr. 13, 2020. The entirety of each of the above-mentioned patent applications is hereby incorporated by reference herein and made a part of this specification.

BACKGROUND

Technical Field

The disclosure is related to a heat dissipation system, in particular to a heat dissipation system of an electronic device.

Description of Related Art

Generally, to improve heat dissipation in a laptop, heat resistance of the system may be reduced, or performance of a heat dissipation fan inside the laptop may be improved. However, with the trend toward light weight and slim shape, the laptop preferably has as few heat dissipation holes as possible. As a result, the heat resistance of the system increases, and further, an air intake amount of the heat dissipation fan decreases, making it difficult for air from the external environment to enter the system and produce heat convection which is necessary for heat dissipation.

Meanwhile, an existing centrifugal fan has large air gaps between blades. Thus, airflows are not easily controlled and backflows are likely to occur, resulting in insufficient wind pressure, thereby affecting heat dissipation efficiency. Moreover, in the case of enlarging an air inlet to increase the air intake amount, if the blades of the centrifugal fan are not provided with a corresponding structure, problems such as air leakage are likely to occur.

In addition, since lighter and thinner electronic devices (such as laptops or tablets) have gradually become a trend, in view of limited internal space, the heat dissipation fan installed in the electronic devices is also required to be as thin as possible. As a result, the limited space prevents the airflows from smoothly entering the heat dissipation fan and exiting therefrom, thus affecting the heat dissipation efficiency of the heat dissipation fan.

Based on the above, a means of effectively improving at least one of the wind pressure and the air intake amount of the heat dissipation fan in the presence of the heat resistance of the system is desired to solve the aforementioned problem.

SUMMARY

The disclosure provides a centrifugal heat dissipation fan and a heat dissipation system of an electronic device, wherein the centrifugal heat dissipation fan has outlets disposed in different radical directions, such that a heat dissipation system with good heat dissipation efficiency can be provided in the electronic device.

The heat dissipation system of an electronic device of the disclosure includes a body, a plurality of heat sources disposed in the body, and at least one centrifugal heat dissipation fan disposed in the body. The at least one centrifugal heat dissipation fan includes a housing and an impeller. The housing has at least one inlet disposed along an axis and a plurality of outlets in different radial directions, and the plurality of outlets respectively correspond to the plurality of heat sources. The impeller is disposed in the housing along the axis.

Based on the above, since the housing of the centrifugal heat dissipation fan has the outlets in different radial directions, the centrifugal heat dissipation fan can be optimally configured in the body of the electronic device according to the positions of the heat sources. This breaks through the conventional design concept of centrifugal heat dissipation fans. In addition, an airflow is taken into the housing from an axial inlet and is then driven by rotation of the impeller to be discharged from different outlets. The outlets respectfully correspond to the heat sources and guide the desired airflows to the heat sources or an object requiring heat dissipation, thereby effectively improving heat dissipation efficiency of the centrifugal heat dissipation fan in the body.

DESCRIPTION OF THE EMBODIMENTS

Figure 1:
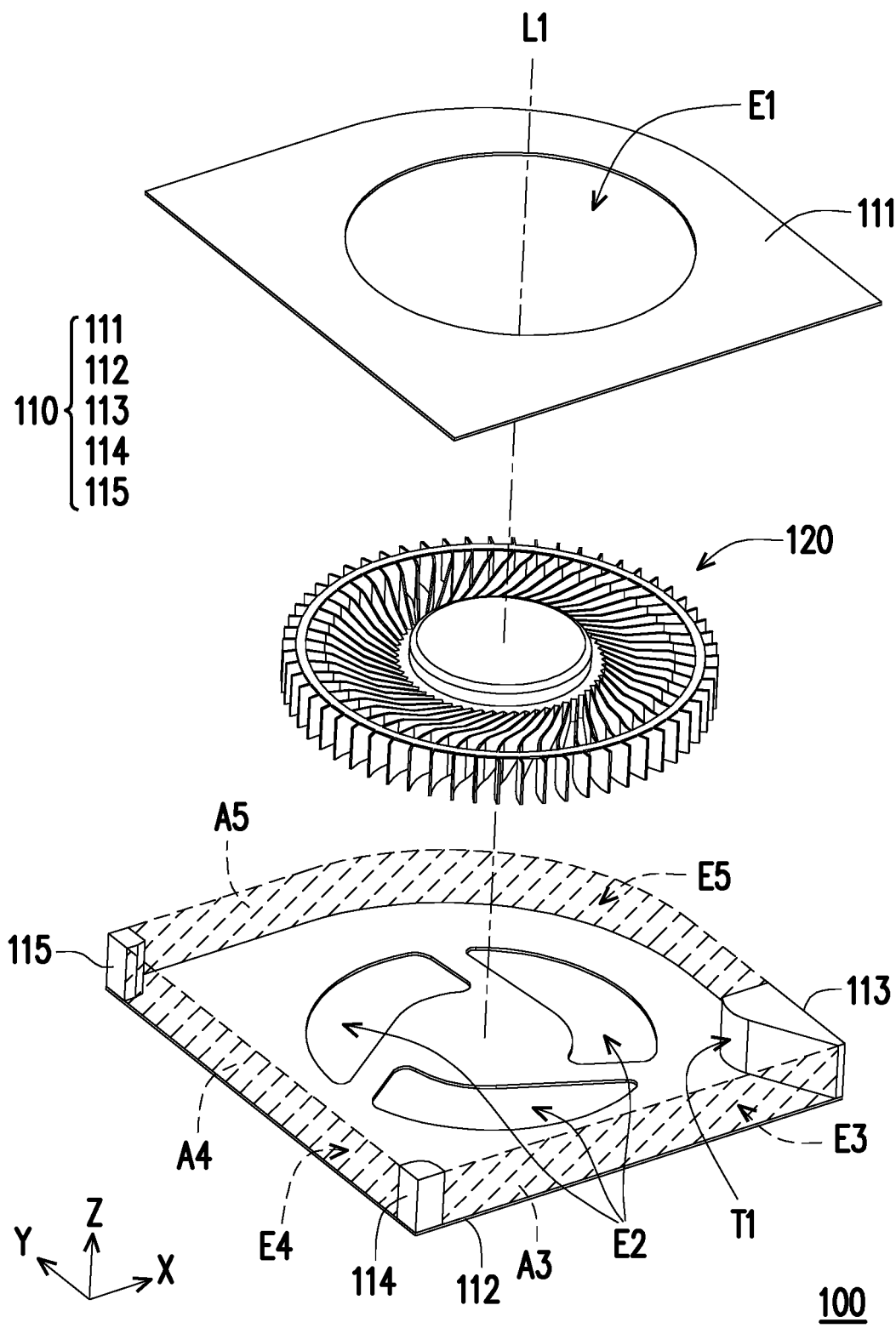
FIG. 1 is an exploded view of a centrifugal heat dissipation fan according to an embodiment of the disclosure.
Figure 2:
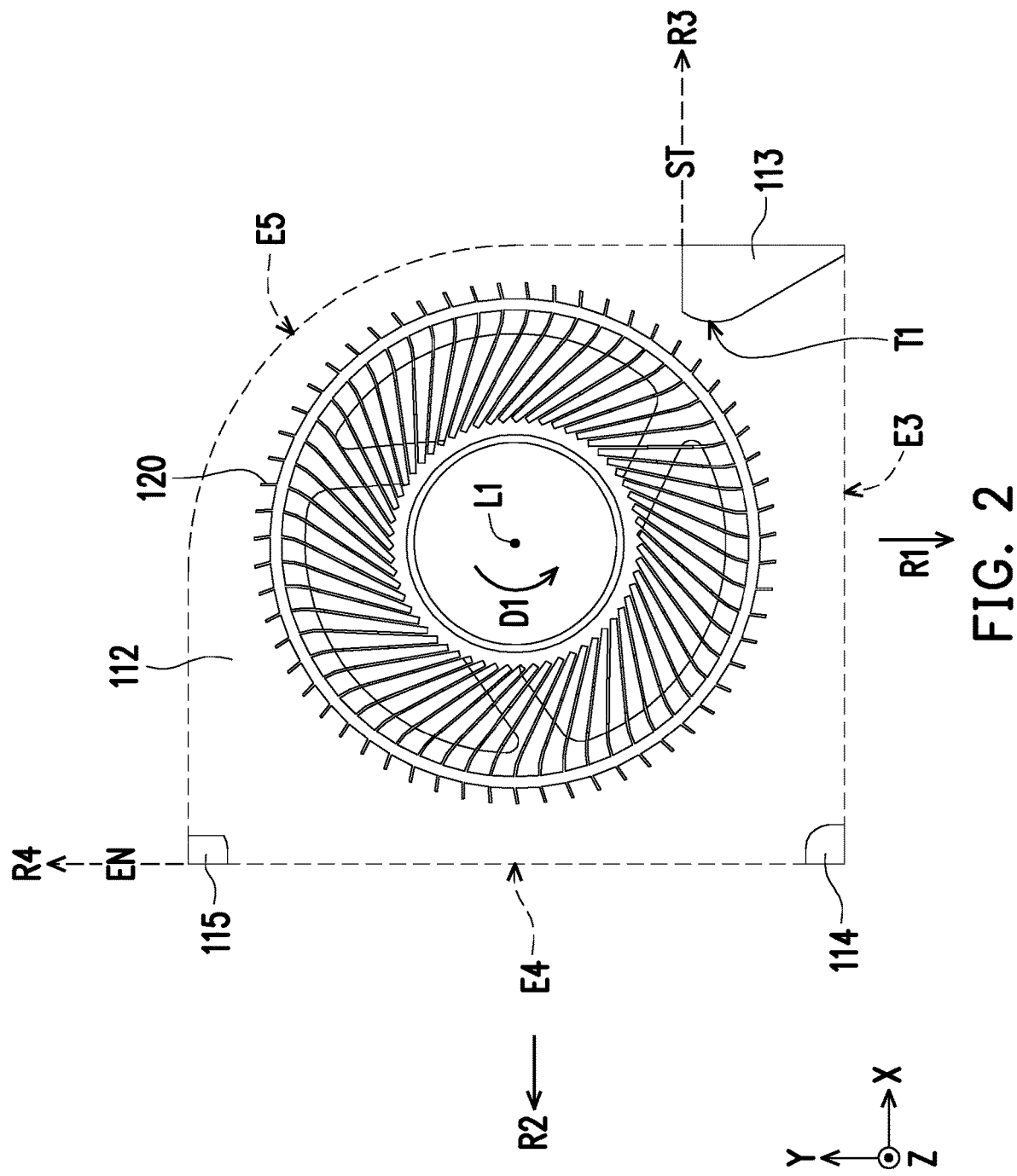
FIG. 2 is a top view of the centrifugal heat dissipation fan in FIG. 1.
Figure 3:
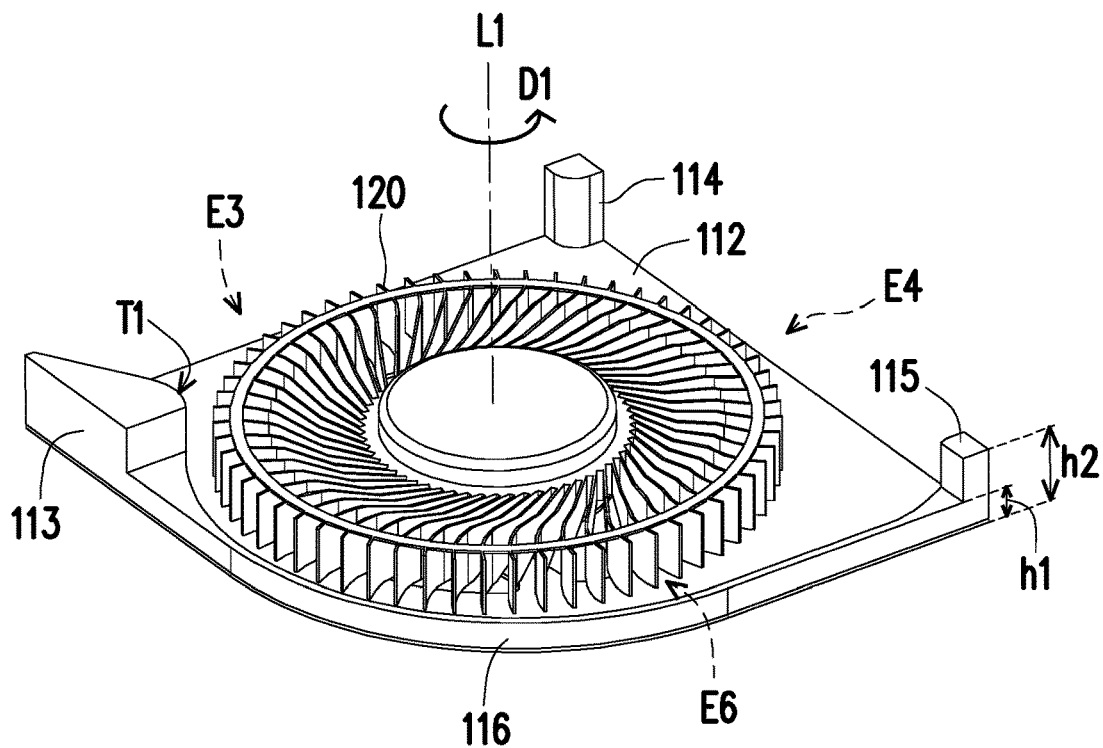
FIGS. 3 to 6 are schematic views of centrifugal heat dissipation fans according to different embodiments of the disclosure.

FIG. 1 is an exploded view of a centrifugal heat dissipation fan according to an embodiment of the disclosure. FIG. 2 is a top view of the centrifugal heat dissipation fan in FIG. 1. Also, some members in FIG. 1 are omitted in FIG. 2 for easily identifying an inner part of the centrifugal heat dissipation fan. A rectangular coordinate system X-Y-Z is provided here for facilitating the description. Referring to FIG. 1 and FIG. 2 together, a centrifugal heat dissipation fan 100 includes a housing 110 and an impeller 120. The housing 110 has at least one inlet (two inlets, E1 and E2, are illustrated for exemplary purposes) disposed along an axis L1 and a plurality of outlets disposed in different radial directions and apart from each other. The impeller 120 is disposed in the housing 110 along the axis L1. It is noted that a method for driving the centrifugal heat dissipation fan 100 (for example, rotating the centrifugal heat dissipation fan 100 by a motor connected to the impeller 120) is known from the related art and a description thereof is omitted in the present embodiment. When the impeller 120 rotates in the housing 110 about the axis L1, airflows are generated, enter the housing 110 through the inlets E1 and E2, and exit the housing 110 through the outlets in different radial directions.

In the present embodiment, the housing 110 includes an upper cover 111, a base 112, and side wall structures 113, 114, and 115, wherein the upper cover 111 has the inlet E1, the base 112 has the inlet E2, and the side wall structures 113, 114, and 115 are connected between the upper cover 111 and the base 112 so as to form the outlets in different radial directions with the upper cover 112 and the base 112. Here, the outlets disposed apart from each other are defined as a first main outlet E3, a second main outlet E4, and a sub-outlet E5. The side wall structure 113 of the housing 110 has an inner wall tongue part T1 between and adjoining the first main outlet E3 and the sub-outlet E5. Thus, along a rotation direction D1 of the impeller 120, the inner wall tongue part T1, the sub-outlet E5, the second main outlet E4, and the first main outlet E3 adjoin each other in sequence in a counter-clockwise loop configuration.

Moreover, the first main outlet E3 and the second main outlet E4 are each a planar outlet, and the sub-outlet E5 is an arc outlet. Furthermore, a sum of an area A3 of the first main outlet E3 and an area A4 of the second main outlet E4 is greater than an area A5 of the sub-outlet E5 (A3+A4>A5), wherein an air-out radial direction R1 of the first main outlet E3 and an air-out radial direction R2 of the second main outlet E4 orthogonally intersect each other. As shown in FIG. 2, the air-out radial direction R1 is substantially a negative Y-axis direction, the air-out radial direction R2 is substantially a negative X-axis direction, and an air-out direction of the sub-outlet E5 includes different radial directions. In other words, in the present embodiment, the sub-outlet E5 has, at a start point ST (that is, the inner wall tongue part T1 serves as the start point of the sub-outlet E5), an air-out radial direction R3 which is substantially a positive X-axis direction, and has, at an end point EN, an air-out radial direction R4 which is substantially a positive Y-axis direction. Accordingly, the sub-outlet E5 substantially covers a circumferential angle of 90 degrees. That is to say, the side wall structure 113 and the side wall structure 115 are substantially taken respectively as the start point and the end point of the range of the sub-outlet E5 of the centrifugal heat dissipation fan 100 in the present embodiment.

Based on the above, according to the above configuration of the housing 110, in the presence of the first main outlet E3 and the second main outlet E4, the sub-outlet E5 is further formed on the arc side surface of the housing 10. In this way, not only an additional guide path is provided for a heat dissipation airflow, but external airflows can be continuously taken into the housing 110 from the inlets E1 and E2 during continuous rotation of the impeller 120 thanks to the characteristics of the centrifugal heat dissipation fan 100 of taking in the air axially and outputting the air radially. Therefore, the overall air output amount of the centrifugal heat dissipation fan 100 is effectively increased.

FIGS. 3 to 6 are schematic views of centrifugal heat dissipation fans according to different embodiments of the disclosure, wherein the same structures as those in the aforementioned embodiment are denoted by the same reference numerals and descriptions thereof will not be repeated. First, referring to FIG. 3 in which the upper cover of the housing is omitted, in the present embodiment, an orthographic projection dimension of a sub-outlet E6 on the axis L1 is less than an orthographic projection dimension of the housing on the axis L1, that is, a side wall structure 116 is further connected between the side wall structure 113 and the side wall structure 115. In addition, an axial dimension h1 of the side wall structure 116 along the axis L1 is less than an axial dimension h2 of the housing along the axis L1, which results in that the sub-outlet E6 is substantially smaller than the sub-outlet E5 of the aforementioned embodiment. The reason is that in an existing electronic device body, electronic components have either a planar design or a planar layered design, and the sub-outlet E6 can be used to guide a heat dissipation airflow to a desired position in accordance with the aforementioned layered design. That is, when a heat source is located in a different layer from the other components in a thickness direction parallel to the axis L1, the sub-outlet E6 can be targeted at the heat source that requires heat dissipation. Meanwhile, due to the presence of the side wall structure 116, some airflows can be kept inside the housing and continuously compressed by the impeller 120 and the side wall structure 116, so that a certain wind pressure is maintained at the following second main outlet E4 and first main outlet E3.

Figure 4:
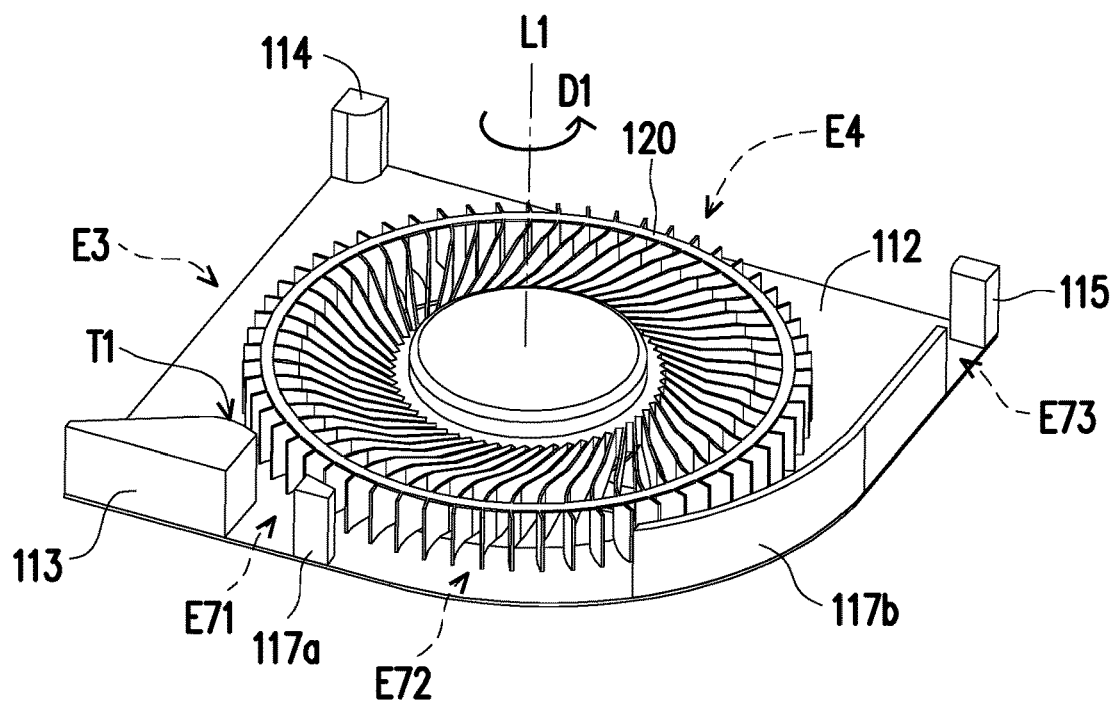
Figure 5:
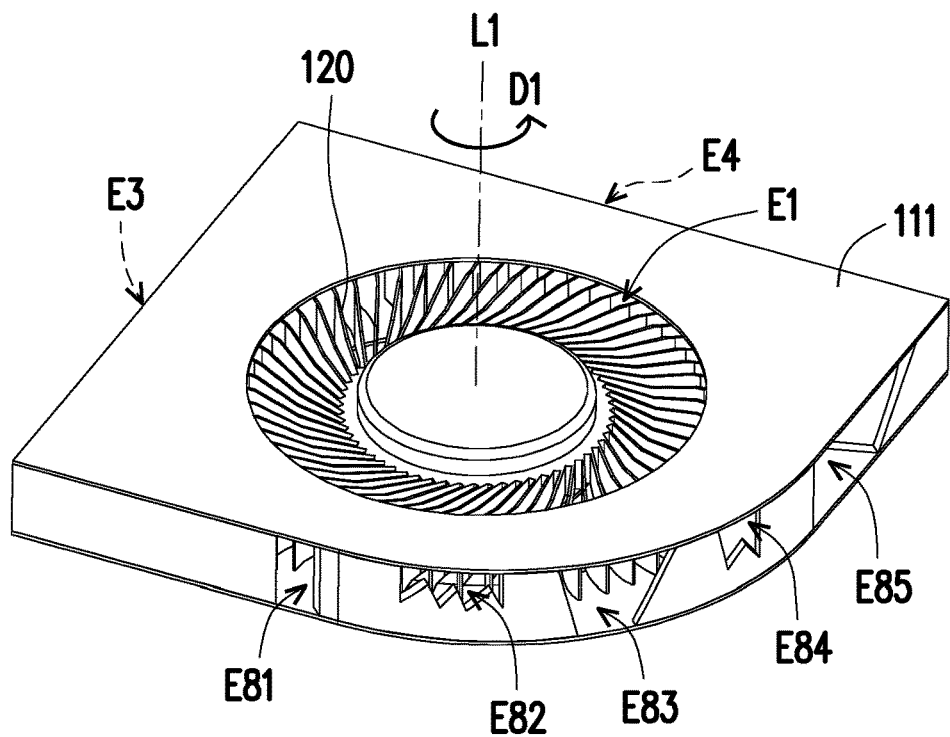

Next, referring to FIG. 4, the housing of the present embodiment has a plurality of sub-outlets E71, E72, and E73 disposed in different radial directions and apart from each other. That is, side wall structures 117a and 117b are additionally disposed between the side wall structure 113 and the side wall structure 115 to form sub-outlets E71, E72, and E73 at desired positions. Here, the positions, opening dimensions and numbers of the sub-outlets E71, E72, and E73 are not limited, and may be appropriately adjusted according to the requirements of the heat dissipation system of an electronic device. FIG. 5 shows an embodiment similar to that shown in FIG. 4, where sub-outlets E81, E82, E83, E84, and E85 are disposed in different radial directions and have different opening profiles. Similarly, the opening profiles in the present embodiment are not limited and may be appropriately adjusted according to the requirements of the heat dissipation system.

Figure 6:
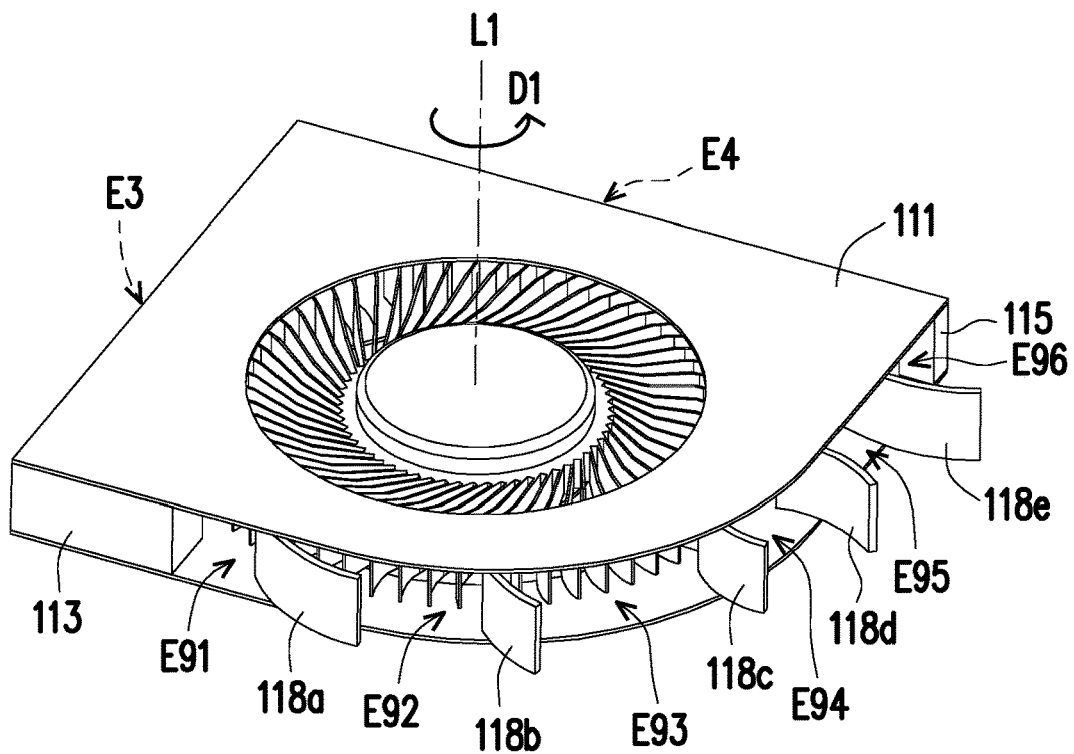

Next, referring to FIG. 6, in the present embodiment, in addition to sub-outlets E91, E92, E93, E94, E95, and E96 that are formed different from each other, guide structures 118a, 118b, 118c, 118d, and 118e are disposed respectively next to the sub-outlets E91, E92, E93, E94, E95, and E96, and extend away from the axis L1 (that is, extend in a direction away from the axis L1. In this way, airflows discharged from the sub-outlets E91, E92, E93, E94, E95, and E96 can be guided by the guide structures 118a, 118b, 118c, 118d, and 118e to the corresponding heat sources requiring heat dissipation.

Figure 7:
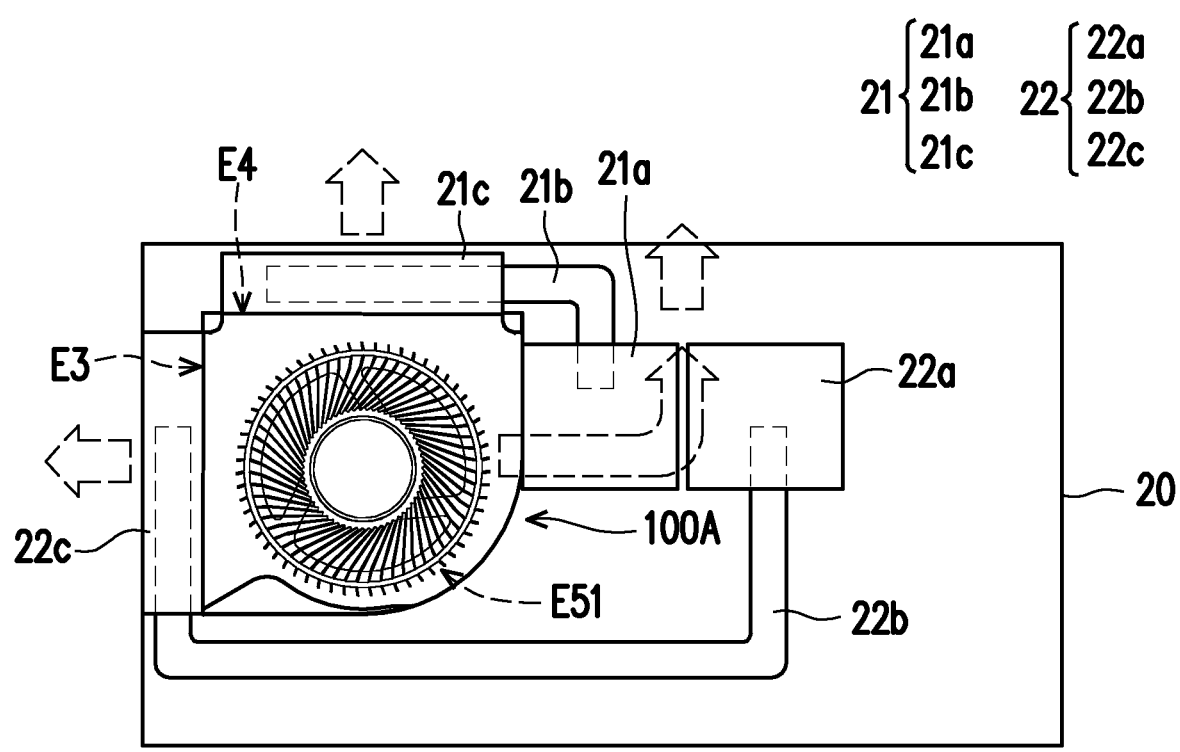
FIG. 7 and FIG. 8 are simple schematic views of heat dissipation systems of an electronic device according to different embodiments of the disclosure.
Figure 8:
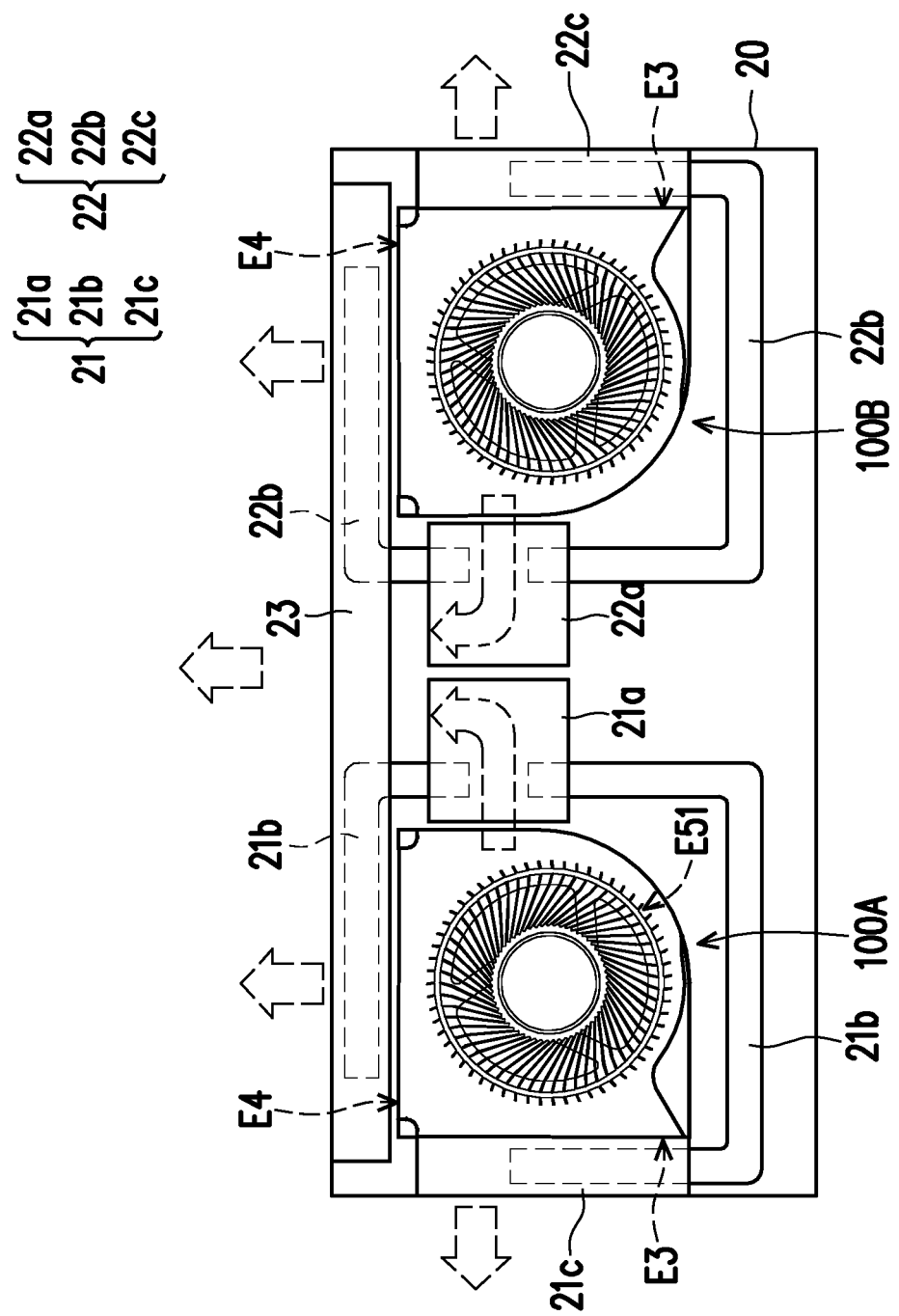

FIG. 7 and FIG. 8 are simple schematic views of heat dissipation systems of an electronic device according to different embodiments of the disclosure. It is noted that in a body 20 of the electronic device, electronic components have either a planar design or a planar layered design. Therefore, a centrifugal heat dissipation fan that outputs air radially is suitable for performing heat dissipation on the electronic device. The heat dissipation systems shown in FIG. 7 and FIG. 8 may both use the centrifugal heat dissipation fans of the different embodiments mentioned above according to requirements.

Referring to FIG. 7 first, the heat dissipation system of an electronic device in the present embodiment includes the body 20, heat sources 21 and 22 disposed in the body 20, and a centrifugal heat dissipation fan 100A disposed in the body 20. The first main outlet E3, the second main outlet E4, and a sub-outlet E51 of the centrifugal heat dissipation fan 100A respectively correspond to the heat sources 21 and 22 that are different from each other.

Moreover, the heat source 21 in the present embodiment includes an electronic chip 21a, a heat conduction element 21b and a heat dissipation fin 21c. The heat conduction element 21b is connected between the electronic chip 21a and the heat dissipation fin 21c so that the electronic chip 21a transfers heat to the heat dissipation fin 21c through the heat conduction element 21b. Furthermore, the second main outlet E4 of the centrifugal heat dissipation fan 100A corresponds to the heat dissipation fin 21c, and the sub-outlet E51 corresponds to the electronic chip 21a. The heat source 22 in the present embodiment includes an electronic chip 22a, a heat conduction element 22b, and a heat dissipation fin 22c. The heat conduction element 22b is connected between the electronic chip 22a and the heat dissipation fin 22c so that the electronic chip 22a transfers heat to the heat dissipation fin 22c through the heat conduction element 22b. The first main outlet E3 of the centrifugal heat dissipation fan 100A corresponds to the heat dissipation fin 22c, and the sub-outlet E51 of the centrifugal heat dissipation fan 100A corresponds to the electronic chip 22a. Accordingly, the electronic chips 21a and 22a are disposed inside the body 20, the heat dissipation fins 21c and 22c are disposed at edges inside the body 20. Therefore, by the first main outlet E3, the second main outlet E4 and the sub-outlet E5 in different radial directions, the centrifugal heat dissipation fan 100A performs inward heat dissipation on the heat dissipation electronic chips 21a and 22a and outward heat dissipation on the heat dissipation fins 21c and 22c at the same time.

Here, the heat conduction elements 21b and 22b are exemplified by heat pipes, and in another embodiment not shown, they may be vapor chambers.

Referring to FIG. 8, the heat dissipation system of an electronic device in the present embodiment includes the body 20, the heat sources 21 and 22 disposed in the body 20, and the centrifugal heat dissipation fan 100A and a centrifugal heat dissipation fan 100B disposed in the body 20. Unlike the aforementioned embodiments, in the present embodiment, two centrifugal heat dissipation fans, namely 100A and 100B, simultaneously dissipate heat from a plurality of heat sources. The heat sources 21 and 22 are the same as those in the aforementioned embodiments. However, a heat dissipation fin 23 is added in the present embodiment. Therefore, the centrifugal heat dissipation fan 100A faces outward of the body 20 and dissipates heat from the heat dissipation fins 21c and 23 at the same time, and the centrifugal heat dissipation fan 100B faces outward of the body 20 and dissipates heat from the heat dissipation fins 21c and 23 at the same time. In the meantime, the centrifugal heat dissipation fans 100A and 100B respectively provide heat dissipation airflows from two opposite sides of the electronic chips 21a and 22a, and the heat dissipation airflows, after converging, flow outward of the body 20 to dissipate heat from the heat dissipation fin 23. In other words, the present embodiment is a further configured heat dissipation system by having two centrifugal heat dissipation fans 100A and 100B.

In summary, in the aforementioned embodiments of the disclosure, since the housing of the centrifugal heat dissipation fan has the outlets in different radial directions, the centrifugal heat dissipation fan can be optimally configured in the body of the electronic device according to the positions of the heat sources. This breaks through the conventional design concept of centrifugal heat dissipation fans. In addition, an airflow is taken into the housing from an axial inlet and is then driven by rotation of the impeller to be discharged from different outlets. The outlets respectfully correspond to the heat sources and guide the desired airflows to the heat sources or an object requiring heat dissipation, thereby making it easy to design a heat dissipation system and effectively improving heat dissipation efficiency of the centrifugal heat dissipation fan in the body.

What is claimed is:

1. A heat dissipation system of an electronic device, comprising: a body; a plurality of heat sources disposed in the body; at least one centrifugal heat dissipation fan disposed in the body and comprising: a housing having at least one inlet disposed along an axis and a plurality of outlets in different radial directions, wherein the plurality of outlets respectively correspond to the plurality of heat sources; and an impeller disposed in the housing along the axis;
   wherein the plurality of heat sources comprise at least one electronic chip, at least one heat conduction element, and at least one heat dissipation fin, the at least one electronic chip transfers heat to the at least one heat dissipation fin through the at least one heat conduction element, and the plurality of outlets respectively correspond to the at least one electronic chip, the at least one heat conduction element, or the at least one heat dissipation fin; and
   wherein the at least one electronic chip is disposed in the body, the at least one heat dissipation fin is disposed at an edge inside the body, some of the plurality of outlets face inward of the body to correspond to the at least one electronic chip, and others of the plurality of outlets face outward of the body to correspond to the at least one heat dissipation fin.

2. The heat dissipation system of an electronic device of claim 1, wherein the housing has a first main outlet, a second main outlet, at least one sub-outlet and an inner wall tongue part disposed apart from each other, the inner wall tongue is between and adjoins the first main outlet and the at least one sub-outlet, and along a rotation direction of the impeller, the inner wall tongue part, the at least one sub-outlet, the second main outlet, and the first main outlet adjoin each other in sequence in a loop configuration.

3. The heat dissipation system of an electronic device of claim 2, wherein the first main outlet and the second main outlet are each a planar outlet, and the at least one sub-outlet is an arc outlet.

4. The heat dissipation system of an electronic device of claim 2, wherein a sum of an area of the first main outlet and an area of the second main outlet is greater than an area of the at least one sub-outlet.

5. The heat dissipation system of an electronic device of claim 2, wherein an air-out radial direction of the first main outlet and an air-out radial direction of the second main outlet orthogonally intersect each other.

6. The heat dissipation system of an electronic device of claim 2, wherein an orthographic projection dimension of the at least one sub-outlet on the axis is less than an orthographic projection dimension of the housing on the axis.

7. The heat dissipation system of an electronic device of claim 2, wherein the housing has a plurality of sub-outlets in different radial directions.

8. The heat dissipation system of an electronic device of claim 2, wherein the housing further has at least one guide structure disposed at the at least one sub-outlet and extending away from the axis.

* * * * *